United States Patent
Inazuki et al.

(10) Patent No.: US 10,488,750 B2
(45) Date of Patent: Nov. 26, 2019

(54) MASK BLANK AND MAKING METHOD

(71) Applicant: Shin-Etsu Chemical Co., Ltd., Tokyo (JP)

(72) Inventors: Yukio Inazuki, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 109 days.

(21) Appl. No.: 15/068,047

(22) Filed: Mar. 11, 2016

(65) Prior Publication Data

US 2016/0266485 A1 Sep. 15, 2016

(30) Foreign Application Priority Data

Mar. 13, 2015 (JP) ................................. 2015-050806

(51) Int. Cl.
  *H01L 21/203* (2006.01)
  *G03F 1/50* (2012.01)

(52) U.S. Cl.
  CPC ..................... *G03F 1/50* (2013.01)

(58) Field of Classification Search
  CPC . G03F 1/50; G03F 1/66; G03F 7/0035; H01L 21/203; H01L 21/0337
  USPC .......................................................... 430/5
  See application file for complete search history.

(56) References Cited

U.S. PATENT DOCUMENTS

| | | | | |
|---|---|---|---|---|
| 2002/0088771 A1* | 7/2002 | Hixson | ............. | H01J 37/32623 216/67 |
| 2003/0013023 A1 | 1/2003 | Chan | | |
| 2005/0019674 A1 | 1/2005 | Okubo et al. | | |
| 2012/0021341 A1* | 1/2012 | Watanabe | ................ | G03F 1/78 430/5 |
| 2012/0100470 A1 | 4/2012 | Nozawa et al. | | |
| 2015/0301441 A1* | 10/2015 | Hamamoto | ............... | G03F 1/24 430/5 |
| 2015/0338731 A1 | 11/2015 | Nozawa et al. | | |

FOREIGN PATENT DOCUMENTS

| | | |
|---|---|---|
| JP | 55-68627 A | 5/1980 |
| JP | 59-3437 A | 1/1984 |
| JP | 4-371952 A | 12/1992 |
| JP | 8-305002 A | 4/2009 |
| JP | 2009-80510 A | 4/2009 |
| JP | 2010-175655 A | 8/2010 |
| JP | 2012-32823 A | 2/2012 |
| JP | 2012-252052 A | 12/2012 |
| JP | 2013-140236 A | 7/2013 |
| JP | 2014-98929 A | 5/2014 |
| JP | 2014-232191 A | 12/2014 |
| WO | WO 2004/051369 A1 | 6/2004 |

OTHER PUBLICATIONS

Japanese Office Action, dated Dec. 5, 2017, for Japanese Application No. 2015-050806, with English machine translation.
Japanese Office Action for Japanese Application No. 2015-050806, dated May 1, 2018.
Japanese Office Action dated Aug. 27, 2019, for corresponding Japanese Application No. 2018-201364.

* cited by examiner

*Primary Examiner* — Daborah Chacko-Davis

(74) *Attorney, Agent, or Firm* — Birch, Stewart, Kolasch & Birch, LLP

(57) ABSTRACT

In a mask blank comprising a transparent substrate and a single layer or multilayer film formed thereon, the film is formed only on the front surface of the substrate, but not on the side surface, chamfer, front surface-chamfer boundary, and back surface-chamfer boundary. The mask blank contains few particle defects, especially the number of particle defects with a certain size is zero.

13 Claims, 2 Drawing Sheets

MASK BLANK AND MAKING METHOD

CROSS-REFERENCE TO RELATED APPLICATION

This non-provisional application claims priority under 35 U.S.C. § 119(a) on Patent Application No. 2015-050806 filed in Japan on Mar. 13, 2015, the entire contents of which are hereby incorporated by reference.

TECHNICAL FIELD

This invention relates to a mask blank which is processed to form a mask (transfer mask) for use in the microfabrication of semiconductor integrated circuits or the like, and a method for preparing the mask blank.

BACKGROUND ART

Since mask blanks are processed into masks (transfer masks), typically photomasks, for use in the fabrication of microelectronic devices, they must be free of defects such as particles and pin holes on their surface. With respect to the size of defects, the pattern miniaturization technology requires that the number of defects with a size of greater than 0.1 μm be zero.

Such submicron defects are generated by numerous factors. To elucidate the cause-and-effect relationships between all factors and defects, separate experiments are necessary for every factor. Overall experimentation is a quite difficult task. One factor of generating defects in a mask blank is assigned to, in the case of sputter deposition of a film on a substrate, those film portions deposited on chamfers and side surfaces of the mask blank. Since the process of manufacturing a mask blank includes the step of handling a mask blank substrate or a mask blank, contact marks by the handling tool are necessarily left on the substrate. If the point of contact during the handling step is positioned on a portion of the front or back surface of the substrate that is subject to exposure on use of the mask, this positioning is undesirable because the contact mark becomes a factor of causing defects such as flaws and particles. It is generally recommended that the point of contact during the handling step is positioned on the side surface, chamfer, front surface-chamfer boundary, and back surface-chamfer boundary.

On use of the mask obtained from the mask blank, the chamfer and side surface of the substrate are not the portion of the mask that contributes to pattern transfer. Thus the chamfer and side surface of the substrate are not considered a subject of defect inspection. Since the conventional defect inspection unit makes access to the film formed on the front surface of the substrate, high-precision inspection is not performed on the chamfer and side surface of the substrate even though flaws or particles are on these sites. Thus it remains unconfirmed how a film is deposited at these sites.

If flaws or particles are present on the substrate or film of the mask blank, a film deposited on the substrate or film (in the latter case, a film disposed remote from the substrate) becomes fragile or peelable at the flaw or particle-covering site due to weak bonding force. If a film is deposited on the side surface, chamfer, front surface-chamfer boundary, or back surface-chamfer boundary of the substrate, the film tends to peel off on these sites. If spalled film fragments migrate onto the front surface of the mask blank, they become particle defects. This causes to increase defects on the mask blank. Peeling of the film at these sites may be promoted by the washing and transporting steps during mask blank manufacture and the step of processing the mask blank into a mask.

CITATION LIST

Patent Document 1: JP-A 2012-032823

SUMMARY OF INVENTION

An object of the invention is to provide a mask blank having few particle defects, especially wherein the number of particle defects with a certain size is zero; and a method for preparing the mask blank.

With respect to a mask blank comprising a substrate which is transparent to exposure light, and a film formed on the substrate and consisting of a single layer or plural layers, the single layer or each of plural layers being selected from an optical functional film and a processing aid film, the inventors have found that the problem is solved when the film is formed only on the front surface of the substrate, but not on the side surface, chamfer, front surface-chamfer boundary, and back surface-chamfer boundary of the substrate. In the process of preparing the mask blank including the step of handling a substrate with a handling tool by bringing the handling tool in contact with the side surface, chamfer, front surface-chamfer boundary, or back surface-chamfer boundary of the substrate, thus leaving a contact mark at the contact site, the invention avoids the generation of particle defects which are generated in the film if deposited on contact marks. Also in the step of handling the mask blank itself by bringing the handling tool in contact with the side surface, chamfer, front surface-chamfer boundary, or back surface-chamfer boundary of the substrate, the generation of particle defects caused by the contact is avoided since the film is absent at the contact sites. As a result, there is provided a mask blank wherein few particle defects are generated, especially wherein the number of particle defects with a certain size is zero.

Accordingly, the present invention provides a mask blank comprising a substrate which is transparent to exposure light, the substrate having a front surface, back surface, side surface, and chamfer, and a film formed on the substrate and consisting of a single layer or plural layers, the single layer or each of plural layers being selected from an optical functional film and a processing aid film, wherein the film is formed only on the front surface of the substrate, but not on the side surface, the chamfer, the boundary between the front surface and the chamfer, and the boundary between the back surface and the chamfer.

In a preferred embodiment, the film is not formed on a region of the front surface that extends a distance of 0.6 mm from the side surface.

In a preferred embodiment, the film consisting of plural layers is formed on the substrate, the plural layers include two contiguous layers, a layer which is disposed adjacent to the substrate and a layer which is disposed remote from the substrate, and the region where the layer disposed remote from the substrate is formed is not wider than the region where the layer disposed adjacent to the substrate is formed.

In a more preferred embodiment, the region where the layer disposed remote from the substrate is formed is narrower than the region where the layer disposed adjacent to the substrate is formed so that a portion of the surface of the layer disposed adjacent to the substrate is exposed.

In a more preferred embodiment, the layer disposed adjacent to the substrate is a conductive film, the layer disposed remote from the substrate is a non-conductive film, and the layer disposed remote from the substrate is not formed on a region of the front surface that extends a distance of 2 mm from the side surface.

Preferably, the conductive film has a sheet resistivity of up to 150 kΩ/☐.

In a preferred embodiment, the plural layers include an outermost layer which is composed of a silicon oxide-based material.

In a preferred embodiment, the optical functional film is selected from a phase shift film composed of a silicon-containing material, a light-shielding film composed of a silicon-containing material, and a light-shielding film composed of a chromium-containing material; and the processing aid film is selected from a hard mask film composed of a silicon-containing material and a hard mask film composed of a chromium-containing material.

The mask blank may further comprise a resist film.

In another aspect, the invention provides a method for preparing the mask blank defined above, comprising the step of sputter depositing the film on the substrate. During the sputter deposition, a shield member is placed on the substrate, but closely spaced apart therefrom to cover a predetermined region of the substrate so that the film may not be deposited on the predetermined region of the substrate.

Advantageous Effects of Invention

In the mask blank of the invention, few particle defects are generated, especially the number of particle defects with a certain size is zero.

Figure 1A:
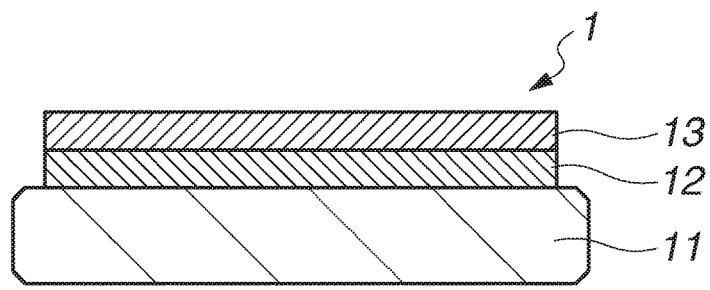
FIGS. 1A to 1D are cross-sectional views of mask blanks in several embodiments of the invention.

DESCRIPTION OF PREFERRED
EMBODIMENTS

The invention provides a mask blank, typically photomask blank, comprising a substrate which is transparent to exposure light and a film formed on the substrate. The substrate has a front surface, a back surface, side surfaces, and chamfers, and is typically a quartz substrate. The film consists of a single layer (i.e., single layer structure film) or plural layers, typically two to four layers (i.e., multilayer structure film). The single layer or each of the plural layers is selected from an optical functional film and a processing aid film, which are commonly formed on photomask blanks.

In the mask blank of the invention, the single layer structure film or multilayer structure film which is selected from an optical functional film and a processing aid film is formed only on the front surface of the substrate, but not on the side surface, the chamfer, the boundary between the front surface and the chamfer, and the boundary between the back surface and the chamfer. Since the boundary between the front surface and the chamfer corresponds to the outer periphery of the substrate front surface, the single layer structure film or multilayer structure film is formed only inside the outer periphery of the substrate (exclusive of the outer periphery). It is noted that in the mask blank, the single layer structure film or multilayer structure film is not formed on the back surface of the substrate. When the film is deposited on the front surface by sputtering, for example, it does not substantially occur that sputtered particles turn round and deposit on the back surface, especially the region of the back surface other than the outer periphery which is the boundary between the back surface and the chamfer.

The substrate is typically a chamfered rectangular plate, especially square plate, but not limited thereto. The substrate has a front surface on which an optical functional film or a processing aid film is formed, a back surface (opposed to the front surface), side surfaces (four surfaces in substrate thickness direction), and chamfers between the front or back surface and the side surfaces (four chamfers on each of the front and back surfaces, total eight). Although there are a plurality of side surfaces, chamfers and boundaries, they are herein referred to in singular form for simplicity sake. For example, a 6-inch square substrate (6025 substrate, 152 mm×152 mm×6.35 mm), which is typically used in photomask blanks for LSI fabrication, is provided with a chamfer (also known as C face) of about 0.5 mm wide between the front surface and the side surface or between the back surface and the side surface, at an angle of about 45° relative to the side surface. On the other hand, the optical functional film may be a light-shielding film, a light-shielding film including an antireflective film, or a phase shift film, typically halftone phase shift film. The processing aid film may be a hard mask film (or etching mask film), an etching stop film, or an electrically conductive film.

In the process of preparing the mask blank, when the mask blank substrate or the mask blank is handled, contact marks are necessarily left thereon, which cause to generate defects. The points of contact during handling are located on the side surface, chamfer, front surface-chamfer boundary and back surface-chamfer boundary. For this reason, in the mask blank of the invention, the single layer structure film or multilayer structure film which is selected from an optical functional film and a processing aid film is formed only on the front surface of the substrate, but not on these sites. In the practice of the invention, the single layer structure film or multilayer structure film is not formed on the boundary between the front surface and the chamfer and the boundary between the back surface and the chamfer, which are simply referred to as "front surface-chamfer boundary" and "back surface-chamfer boundary," respectively. Preferably the range of the front surface-chamfer boundary is a region of the front surface that extends a distance of 0.6 mm inward from the side surface. That is, the region where the film is formed does cover neither the region of the front surface that extends a distance of 0.6 mm inward from the side surface (toward the center of the substrate) nor the front surface-chamfer boundary. Notably, the distance from the side surface is a distance in the plane direction of the front surface from an imaginary perpendicular plane extending from the side surface.

Typical of the mask blank comprising a single layer film formed on a transparent substrate is a photomask blank having a light-shielding film formed on a transparent substrate. Typical of the mask blank comprising a multilayer film formed on a transparent substrate are a phase shift mask blank comprising a transparent substrate, a phase shift film formed thereon and a light-shielding film formed on the phase shift film; a phase shift mask blank comprising a transparent substrate, a phase shift film formed thereon, a light-shielding film formed on the phase shift film, and a hard mask film formed on the light-shielding film; and a photomask blank comprising a transparent substrate, a light-shield film formed thereon and a hard mask film formed on the light-shielding film.

Figure 1B:
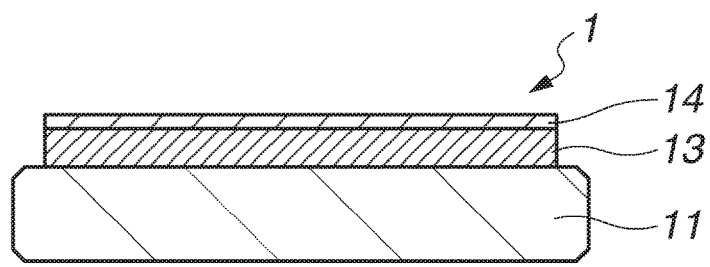

Exemplary mask blanks are illustrated in FIGS. 1A and 1B. FIGS. 1A and 1B are cross-sectional views of exemplary mask blanks according to the invention. FIG. 1A illustrates a mask blank 1 comprising a transparent substrate 11 and a two-layer film formed thereon, the two-layer film including a phase shift film 12 and a light-shielding film 13 as the optical functional film which are stacked in order on the substrate 11. FIG. 1B illustrates a mask blank 1 comprising a transparent substrate 11 and a two-layer film formed thereon, the two-layer film including a light-shielding film 13 as the optical functional film and a hard mask film 14 as the processing aid film which are stacked in order on the substrate 11. In either of the photomask blanks, the multilayer film is formed only on the front surface of the substrate, but not on the side surface, chamfer, front surface-chamfer boundary and back surface-chamfer boundary of the substrate.

The film of single layer or multilayer structure (formed on the photomask blank) selected from an optical functional film and a processing aid film is delineated as above to solve the problem that in the process of manufacturing a mask blank comprising the steps of handling a substrate with a handling tool, and bringing the tool in contact with the side surface, chamfer, front surface-chamfer boundary or back surface-chamfer boundary of the substrate so that a contact mark is left in the site, if a film is formed on the contact mark, a particle defect corresponding to the contact mark is generated in the film. In addition, during handling of the mask blank itself, even when the handling tool comes in contact with the side surface, chamfer, front surface-chamfer boundary or back surface-chamfer boundary of the substrate, the contact sites are outside the film, which is free of particle defects which are otherwise caused by contact marks. There is provided a mask blank having a film containing few particle defects, especially wherein the number of particle defects with a predetermined size is zero.

In the mask blank including the film consisting of plural layers formed on the substrate, if the region where an upper layer is formed is wider than the region where a lower layer is formed, then the upper layer includes both an inside portion in contact with the lower layer and an outside portion in contact with a layer below the lower layer, if any, or the substrate. In this case, the inside and outside portions of the upper layer are in contact with different materials. Particularly when a film is sputter deposited on a member including portions of different materials, the film portions deposited thereon are subject to different stresses. Then the deposited film has a specific site at the boundary between different material portions. There is a possibility that stress concentration occurs at the specific site of the film. The stress concentration in the film can cause peeling, and spalled film fragments can cause defects to the mask blank or mask. For minimizing the cause of defects, in the mask blank including a film composed of plural layers including one or more of combinations consisting of two contiguous layers, a layer which is disposed adjacent to the substrate and a layer which is disposed remote from the substrate, in each of the combinations, region where the remote layer is formed is not wider than (i.e., equal to or narrower than) the region where the adjacent layer is formed. In the invention, the layer which is disposed adjacent to the substrate in the combination includes both of a layer which is directly contacted to the substrate and a layer which is not contacted to the substrate. It is noted that of two contiguous layers deposited on a substrate, a layer which is disposed adjacent to the substrate is referred to as "adjacent layer" and a layer which is disposed remote from the substrate is referred to as "remote layer".

A process of preparing a mask from the mask blank generally involves the steps of forming a resist film on the mask blank, and patterning the resist film using an EB writing system. For effective operation of the EB writing system, at least one electrically conductive film is included in the mask blank so that the EB projected to the mask blank may not cause any charge-up to the mask blank. For the purpose of preventing the EB projected to the mask blank from causing any charge-up thereto, the EB writing system generally includes a ground pin which comes in contact with the outer periphery of the front surface of the mask blank for grounding the mask blank.

In the embodiment of the mask blank including the film consisting of plural layers formed on the substrate, preferably the region where the remote layer is formed is not wider than (i.e., equal to or narrower than) the region where the adjacent layer is formed, and more preferably the region where the remote layer is formed is narrower than the region where the adjacent layer is formed, so that a (peripheral) portion of the surface of the adjacent layer is exposed. Preferably the remote layer is not formed on a region of the substrate front surface that extends a distance of 2 mm, more preferably 3 mm from the side surface. Differently stated, the region where the remote layer is formed preferably extends on the substrate front surface inward from a distance of 2 mm, more preferably 3 mm from the side surface toward the center of the substrate. Notably, the distance from the side surface is a distance in the plane direction of the front surface from an imaginary perpendicular plane extending from the side surface.

Figure 1C:
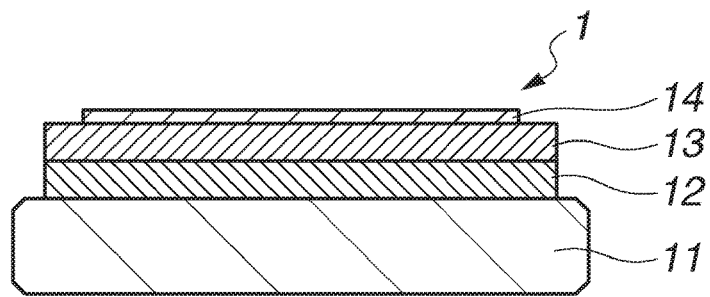
Figure 1D:
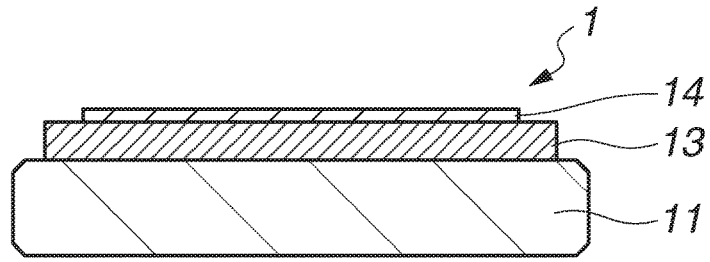

Exemplary mask blanks are illustrated in FIGS. 1C and 1D. FIGS. 1C and 1D are cross-sectional views of exemplary mask blanks according to the invention. FIG. 1C illustrates a mask blank 1 comprising a transparent substrate 11 and a three-layer film formed thereon, the three-layer film including a phase shift film 12 and a light-shielding film 13 as the optical functional film, and a hard mask film 14 as the processing aid film, stacked in order on the substrate. FIG. 1D illustrates a mask blank 1 comprising a transparent substrate 11 and a two-layer film formed thereon, the two-layer film including a light-shielding film 13 as the optical functional film and a hard mask film 14 as the processing aid film, stacked in order on the substrate. In either of the photomask blanks, the multilayer film is formed only on the front surface of the substrate, but not on the side surface, chamfer, front surface-chamfer boundary and back surface-chamfer boundary. In either of the photomask blanks, two contiguous layers included in the plural layers are a light-shielding film and a hard mask film, the region where the hard mask film is formed is narrower than the region where the light-shielding film is formed, so that a (peripheral) portion of the surface of the light-shielding film is exposed.

The embodiment wherein the region where the remote layer is formed is narrower than the region where the adjacent layer is formed and the adjacent layer is electrically conductive, is advantageous in that the ground pin can be directly contacted with the exposed portion of the adjacent layer that is a conductive film, even when the remote layer is non-conductive. Preferably the conductive film has a sheet resistivity of up to 150 kiloohm/square (kΩ/□), more preferably up to 10 kΩ/□. On the other hand, the non-conductive film has a sheet resistivity of preferably at least 1 MΩ/□, more preferably at least 100 MΩ/□.

In the mask blank, the optical functional film may be a phase shift film composed of a silicon-containing material, a light-shielding film composed of a silicon-containing material, or a light-shielding film composed of a chromium-containing material. Also the processing aid film may be a hard mask film composed of a silicon-containing material or a hard mask film composed of a chromium-containing material.

Illustrative combinations of the optical functional film with the hard mask film include a structure having a silicon-containing phase shift film and a chromium-containing light-shielding film stacked in order, and a structure having a silicon-containing phase shift film, a chromium-containing light-shielding film and a silicon-containing hard mask film stacked in order. The preferred mask blank is a phase shift mask blank having these films stacked on a transparent substrate. Also exemplary are a structure including a chromium-containing light-shielding film, for example, a structure having a chromium-containing light-shielding film and a silicon-containing hard mask film stacked in order, and a structure including a silicon-containing light-shielding film, for example, a structure having a silicon-containing light-shielding film and a chromium-containing hard mask film stacked in order. Another preferred mask blank is a binary mask blank having these films stacked on a transparent substrate. For forming a mask pattern of finer size, a mask blank including a silicon-containing light-shielding film amenable to micropatterning is particularly preferred.

In the case of a structure having a silicon-containing phase shift film, a chromium-containing light-shielding film, and a silicon-containing hard mask film stacked in order, for example, the non-conductive phase shift film is formed over a wide inside region on the front surface exclusive of the front surface-chamfer boundary, the conductive light-shielding film is formed on the phase shift film over a region equal to or slightly narrower than the region of the phase shift film, and the non-conductive hard mask film is formed on the light-shielding film over a narrower region than the region of the light-shielding film such that a (peripheral) portion of the surface of the light-shielding film is exposed. Then, the mask blank is advantageously grounded during EB lithography because the ground pin of the EB writing system can be directly contacted with the light-shielding film. In particular, the above-mentioned delineation of plural layers ensures that a mask blank which is convenient to ground during EB lithography is constructed even when the outermost one of plural layers is a film composed of a non-conductive silicon oxide-based material, especially silicon oxide, and serving as a hard mask film. In this sense, the invention is most advantageous when the outermost one of plural layers is a film composed of a silicon oxide-based material.

Figure 2:
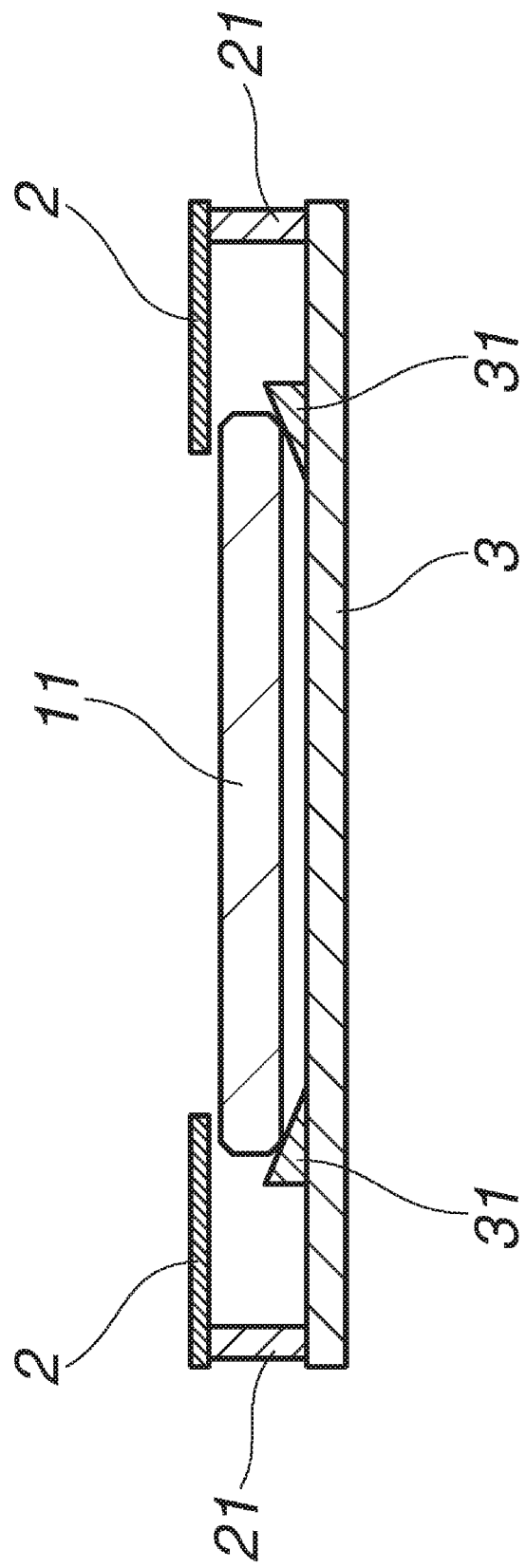
FIG. 2 is a cross-sectional view of an exemplary setup for preparing the mask blank, the setup including a shield member.

The mask blank is prepared by depositing the film of a single layer or plural layers by sputtering. A shield member is placed on the substrate, but closely spaced apart therefrom to cover a predetermined region of the substrate so that the film may not be deposited on the predetermined region of the substrate, that is, the side surface, chamfer, front surface-chamfer boundary, and back surface-chamfer boundary of the substrate. Specifically, as shown in FIG. 2, a shield member 2 is placed between a transparent substrate 11 and a sputter target (not shown) and closely spaced apart from the substrate 11 so as to cover a peripheral portion of the front surface of the substrate 11 and extend outward from the front surface-chamfer boundary. With this setup, the target material is sputtered toward the front surface of the substrate 11 to deposit a film thereon. Also illustrated in FIG. 2 are a support member 21 for the shield member 2, a platform 3 on which the substrate 11 is rested, and a wedge or jig 31 for providing point or line support to the substrate 11. If it is desired to alter the region where the film is deposited, the opening of the shield member may be accordingly altered. In an example using a 6-inch square substrate, if a shield member having an opening of 150 mm squares is used, then the region of film deposition is a region of the front surface that extends inward from a line of 1 mm apart from the side surface; if a shield member having an opening of 146 mm squares is used, then the region of film deposition is a region of the front surface that extends inward from a line of 3 mm apart from the side surface.

EXAMPLE

Examples of the invention are given below by way of illustration, but not by way of limitation.

Example 1

A 6025 quartz substrate of 152 mm squares was furnished. A shield plate having an opening of 150 mm squares was placed right above the substrate, but closely spaced apart from the substrate. By sputtering, a phase shift film containing Mo, Si, O and N was deposited on the substrate to a thickness of 75 nm. Next, with the shield plate having an opening of 150 mm squares closely spaced apart from the substrate, a light-shielding film containing Cr, O and N was sputter deposited on the phase shift film to a thickness of 44 nm. There was obtained a phase shift mask blank having a two-layer film consisting of the silicon-containing phase shift film and the chromium-containing light-shielding film stacked as shown in FIG. 1A.

Example 2

A 6025 quartz substrate of 152 mm squares was furnished. A shield plate having an opening of 150 mm squares was placed right above the substrate, but closely spaced apart from the substrate. By sputtering, a light-shielding film containing Mo, Si, and N was deposited on the substrate to a thickness of 47 nm. Next, with the shield plate having an opening of 150 mm squares closely spaced apart from the substrate, a hard mask film containing Cr, O and N was sputter deposited on the light-shielding film to a thickness of 4 nm. There was obtained a photomask blank having a two-layer film consisting of the silicon-containing light-shielding film and the chromium-containing hard mask film stacked as shown in FIG. 1B.

Example 3

A 6025 quartz substrate of 152 mm squares was furnished. A shield plate having an opening of 150 mm squares was placed right above the substrate, but closely spaced apart from the substrate. By sputtering, a phase shift film containing Mo, Si, O and N was deposited on the substrate to a thickness of 75 nm. Next, with the shield plate having an opening of 150 mm squares closely spaced apart from the substrate, a light-shielding film containing Cr, O and N was sputter deposited on the phase shift film to a thickness of 44 nm. Next, a shield plate having an opening of 146 mm squares was placed right above the substrate, but closely spaced apart from the substrate. By sputtering, a hard mask film containing Si and O was deposited on the light-shielding film to a thickness of 5 nm. There was obtained a phase shift mask blank having a three-layer film consisting of the silicon-containing phase shift film, the chromium-containing light-shielding film and the silicon-containing hard mask film stacked as shown in FIG. 1C.

Example 4

A 6025 quartz substrate of 152 mm squares was furnished. A shield plate having an opening of 150 mm squares was placed right above the substrate, but closely spaced apart from the substrate. By sputtering, a light-shielding film containing Mo, Si and N was deposited on the substrate to a thickness of 70 nm. Next, a shield plate having an opening of 146 mm squares was placed right above the substrate, but closely spaced apart from the substrate. By sputtering, a hard mask film containing Cr, O and N was deposited on the light-shielding film to a thickness of 10 nm. There was obtained a photomask blank having a two-layer film consisting of the silicon-containing light-shielding film and the chromium-containing hard mask film stacked as shown in FIG. 1D.

The phase shift mask blanks of Examples 1 and 3 and the photomask blanks of Examples 2 and 4 at the side surface, chamfer, front surface-chamfer boundary and back surface-chamfer boundary of the substrate were inspected for appearance by photopic vision. For all the mask blanks, no film deposition was observed at these sites. Also, the mask blanks at these sites were inspected for appearance by scotopic vision with the aid of a collector lamp. For all the mask blanks, no bright gleaming spots were observed.

Comparative Example 1

By sputtering without using a shield plate, a light-shielding film containing Cr, O and N was deposited on a 6025 quartz substrate of 152 mm squares to a thickness of 70 nm. There was obtained a binary mask blank having a single layer film in the form of the chromium-containing light-shielding film.

The binary mask blank at the side surface, chamfer, front surface-chamfer boundary and back surface-chamfer boundary of the substrate was inspected for appearance by photopic vision. Film deposition was observed at these sites. Also, the mask blank at these sites was inspected for appearance by scotopic vision with the aid of a collector lamp. A bright gleaming spot was observed at the front surface-chamfer boundary. The position of the bright gleaming spot was examined to find that the spot corresponded to the portion of the substrate which was contacted by a holder when the substrate was treated in a cleaning machine prior to film deposition. It was confirmed that the film was deposited on a defective portion (flaws or particles) of the substrate damaged by holding operation.

Japanese Patent Application No. 2015-050806 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A mask blank comprising
a substrate which is transparent to exposure light, the substrate having a front surface, back surface, side surface, and chamfer, and
a film (A), wherein
the mask blank is a binary mask blank or a phase shift mask blank,
said film (A) is formed contiguous to the substrate by sputtering,
said film (A) consists of a single layer or plural layers, said single layer or each of said plural layers being selected from an optical functional film and a processing aid film,
all of the layer(s) of said film (A) being formed only on the front surface of the substrate, but not on the side surface, the chamfer, the boundary between the front surface and the chamfer, and the boundary between the back surface and the chamfer, and
all of the layer(s) of said film (A) being formed only on a region of the front surface that extends inward from a distance of 1 mm from the side surface and not formed on the front surface-chamfer boundary.

2. The mask blank of claim 1 wherein
said film (A) consists of plural layers,
the plural layers include one or more of combinations consisting of two contiguous layers,
each of the combinations consists of a layer which is disposed adjacent to the substrate and a layer which is disposed remote from the substrate, and
in said each of the combinations, the region where the layer disposed remote from the substrate is formed is not wider than the region where the layer disposed adjacent to the substrate is formed.

3. The mask blank of claim 2 wherein
in any of said combinations, the region where a layer (A) disposed remote from the substrate is formed is narrower than the region where a layer (B) disposed adjacent to the substrate is formed so that a portion of the surface of the layer disposed adjacent to the substrate is exposed.

4. The mask blank of claim 3 wherein
the layer (B) is a conductive film, the layer (A) is a non-conductive film, and the layer (A) disposed remote from the substrate is not formed on a region of the front surface that extends a distance of 2 mm from the side surface.

5. The mask blank of claim 4 wherein
the conductive film has a sheet resistivity of up to 150 k$\Omega$/□.

6. The mask blank of claim 1 wherein
said film (A) consists of plural layers, and
the plural layers include an outermost layer which is composed of a non-conductive silicon oxide-based material.

7. The mask blank of claim 1 wherein
the optical functional film is selected from a phase shift film composed of a silicon-containing material, a light-shielding film composed of a silicon-containing material, and a light-shielding film composed of a chromium-containing material.

8. The mask blank of claim 1 wherein
the processing aid film is selected from a hard mask film composed of a silicon-containing material and a hard mask film composed of a chromium-containing material.

9. The mask blank of claim 1, further comprising a resist film contiguous to said film (A).

10. A method for preparing the mask blank of claim 1, comprising the steps of:
placing a shield member having an opening on the substrate; and sputter depositing said film (A) on the substrate through the opening of the shield member, wherein during the sputter deposition, the shield member is placed on the substrate, but closely spaced apart therefrom to cover a predetermined region of the substrate so that said film (A) is formed only on the front surface of the substrate, but not on the side surface, the chamfer, the boundary between the front surface and the chamfer, and the boundary between the back surface and the chamfer.

11. The mask blank of claim 1 wherein
the optical functional film is selected from the group consisting of a light-shielding film, a light-shielding film including an antireflective film, and a phase shift film, and the processing aid film is selected from the group consisting of a hard mask film, an etching stop film, and an electrically conductive film.

12. The mask blank of claim 1 wherein
all of the layer(s) of said film (A) is formed only on a region of the front surface that extends inward from a distance of 3 mm from the side surface.

13. The mask blank of claim 1 wherein the substrate is a 6-inch square substrate.

\* \* \* \* \*